(12) United States Patent
Sato

(10) Patent No.: US 8,487,346 B2
(45) Date of Patent: Jul. 16, 2013

(54) SEMICONDUCTOR DEVICE

(75) Inventor: Ken Sato, Saitama (JP)

(73) Assignee: Sanken Electric Co., Ltd., Saitama (JP)

( * ) Notice: Subject to any disclaimer, the term of this patent is extended or adjusted under 35 U.S.C. 154(b) by 322 days.

(21) Appl. No.: 12/883,437

(22) Filed: Sep. 16, 2010

(65) Prior Publication Data

US 2011/0073911 A1 Mar. 31, 2011

(30) Foreign Application Priority Data

Sep. 26, 2009 (JP) ................. 2009-221696

(51) Int. Cl.
*H01L 31/0328* (2006.01)

(52) U.S. Cl.
USPC .... 257/194; 257/190; 257/191; 257/E29.246; 257/E29.249

(58) Field of Classification Search
USPC .................. 257/190–194, E29.246, E29.248, 257/E29.249
See application file for complete search history.

(56) References Cited

U.S. PATENT DOCUMENTS

| 7,364,988 B2 * | 4/2008 | Harris et al. ................. 438/478 |
| 7,544,963 B2 | 6/2009 | Saxler |
| 2006/0068601 A1 * | 3/2006 | Lee et al. ..................... 438/761 |
| 2009/0045438 A1 * | 2/2009 | Inoue et al. .................. 257/192 |
| 2010/0270591 A1 * | 10/2010 | Ahn .............................. 257/194 |

FOREIGN PATENT DOCUMENTS

JP 2008-539587 T 11/2008

* cited by examiner

*Primary Examiner* — Matthew E Warren
(74) *Attorney, Agent, or Firm* — Wilmer Cutler Pickering Hale and Dorr LLP

(57) ABSTRACT

A semiconductor device including: a substrate, which has a composition represented by the formula: $Al_{a'}Ga_{1-a'}N$, wherein a' satisfies $0<a'\leq1$; an active layer, which is formed on the substrate, and which has a composition represented by the formula: $Al_mGa_{1-m}N$, wherein m' satisfies $0\leq m'<1$; a buffer layer disposed between the active layer and the substrate; and a first main electrode and a second main electrode, which are formed on the active layer, and which are separated from each other, wherein the semiconductor device is operated by electric current flowing between the first main electrode and the second main electrode in the active layer, and wherein the buffer layer has a composition represented by the formula: $Al_bIn_{1-b}N$, wherein a composition ratio b satisfies $0<b<1$, wherein the composition ratio b satisfies $m'<b<a'$.

8 Claims, 5 Drawing Sheets

SEMICONDUCTOR DEVICE

CROSS-REFERENCE TO RELATED APPLICATION

This application claims priority from Japanese Patent Application No. 2009-221696 filed on Sep. 26, 2009, the entire subject matter of which is incorporated herein by reference.

BACKGROUND

1. Technical Field

The present invention relates to a structure of a semiconductor device including an active region on a hetero junction of a nitride semiconductor.

2. Description of the Related Art

As a semiconductor device using a compound semiconductor, specifically, a device for high power/high frequency, a High Electron Mobility Transistor (HEMT) device using gallium nitride (GaN) has been employed. A schematic structure of a cross-section of the HEMT device disclosed in JP-A-2008-539587 is shown in FIG. 5. In this FIG. 5, an electron transit layer (channel layer) 93 and an electron supply layer (barrier layer) 94 are formed on a substrate 91 by epitaxial growth method. Here, the substrate 91 is made of aluminum nitride (AlN), the electron transit layer 93 is made of non-doped GaN, and the electron supply layer 94 is made of non-doped AlN. The electron transit layer 93 makes a hetero junction with the substrate 91, and the electron supply layer 94 makes a hetero junction with the electron transit layer 93. Meantime, the term "non-doped" means that an impurity injection is not performed in order to control a conductance level.

In the HEMT device 90, a two-dimensional electron gas layer (2DEG layer) 98 is formed within the electron transit layer 93 based on the hetero junction between the electron transit layer 93 and the electron supply layer 94. The 2DEG layer 98 is a current path flowing electric current between a source electrode 95 and a drain electrode 96. Here, a gate electrode 97 turns on/off the 2DEG layer 98 by voltage applied to the gate electrode 97 and performs the switching operation of the HEMT device 90.

At this time, because speed (mobility rate) of the electrons within the 2DEG layer 98 is extremely high, the HEMT device 90 will be operated at high speed. Moreover, since GaN has larger band-gap energy than gallium arsenide (GaAs), etc., the HEMT device 90 has high insulation withstand voltage and may be perform high power operation. Moreover, because AlN forming the substrate 91 has high insulation property, leak current flowing in a vertical direction of the HEMT device 90 can be suppressed.

However, as shown in FIG. 5, the two-dimensional hole gas layer (2DHG layer) 98 in the HEMT device 90 is formed around an interface between the electron transit layer 93 and the substrate 91 based on the hetero junction between the electron transit layer 93 and the substrate 91. The 2 DHG layer 98 functions as a current path between the source electrode and the drain electrode, but it is difficult that turn off control by a gate structure and the applied voltage. That is, the HEMT device 90 has a structure in which it is easy for the leak current to flow between the source electrode 95 and the drain electrode 96.

Further, since lattice mismatch (difference between lattice constants) is large between the substrate 91 made of AlN and the electron transit layer 93 made of GaN, there are easily generated many crystal defects, such as dislocations, in the interface between the substrate 91 and the electron transit layer 93. Consequently, the deterioration of electrical characteristic of the HEMT device 90, such as on-resistance or current collapse, occurs. Such a problem occurs similarly by use of a substrate made of $Al_xGa_{1-x}N$ ($0<x\leq1$).

This problem is not limited to the HEMT. The problem occurs similarly in lateral devices which include a substrate made of GaN and a hetero structure on the substrate, and in which electric current flows in a lateral direction (a direction parallel to a face of the substrate), when the device operates. Examples of such devices may be Metal Oxide Semiconductor Field Effect Transistor (MOSFET) or Schottky Barrier Diode (SBD), etc.

Accordingly, it is difficult to manufacture the lateral device in which electrical characteristics are good on the substrate including AlN.

SUMMARY

The present invention has been made with consideration of the above problem, and an object of the present invention is to provide the device for solving the problem.

According to one aspect of the invention, there is provided a semiconductor device including: a substrate, which has a composition represented by the formula: $Al_{a'}Ga_{1-a'}N$, wherein a' satisfies $0<a'\leq1$; an active layer, which is formed on the substrate, and which has a composition represented by the formula: $Al_{m'}Ga_{1-m'}N$, wherein m' satisfies $0\leq m'<1$; a buffer layer disposed between the active layer and the substrate; and a first main electrode and a second main electrode, which are formed on the active layer, and which are separated from each other, wherein the semiconductor device is operated by electric current flowing between the first main electrode and the second main electrode in the active layer, and wherein the buffer layer has a composition represented by the formula: $Al_bIn_{1-b}N$, wherein a composition ratio b satisfies $0<b<1$, wherein the composition ratio b satisfies m'<b<a'.

According to another aspect of the invention, there is provided a A semiconductor device comprising: an active layer including an electron transit layer and an electron supply layer; a base substrate; a first buffer layer formed on the base substrate; a second buffer layer formed between the first buffer layer and the active layer; and a first electrode and a second electrode, which are formed on the electron supply layer, and which are separated from each other, wherein the electron supply layer has a composition represented by the formula: $Al_mGa_{1-m}N$, wherein a composition ratio m satisfies $0\leq m<1$; wherein the first buffer layer has a composition represented by the formula: $Al_aGa_{1-a}N$, wherein a composition ratio a satisfies $0<a<1$; and wherein the second buffer layer has a composition represented by the formula: $Al_bIn_{1-b}N$, wherein a composition ratio b satisfies $0<b<1$, and wherein the composition ratio b satisfies m<b<a.

According to the aspect of the present invention, it is possible to manufacture the lateral device in which the electrical characteristics are improved on the substrate including AlN.

DETAILED DESCRIPTION OF THE PREFERRED EMBODIMENTS

A Semiconductor device according to an embodiment of the present invention, specifically a High Electron Mobility Transistor (HEMT) device, will be described in detail. In the HEMT device, a hetero structure is formed on a substrate including AlN, and the HEMT is operated by electric current flows in a lateral direction (in a direction parallel to the surface of the substrate).

Figure 1:
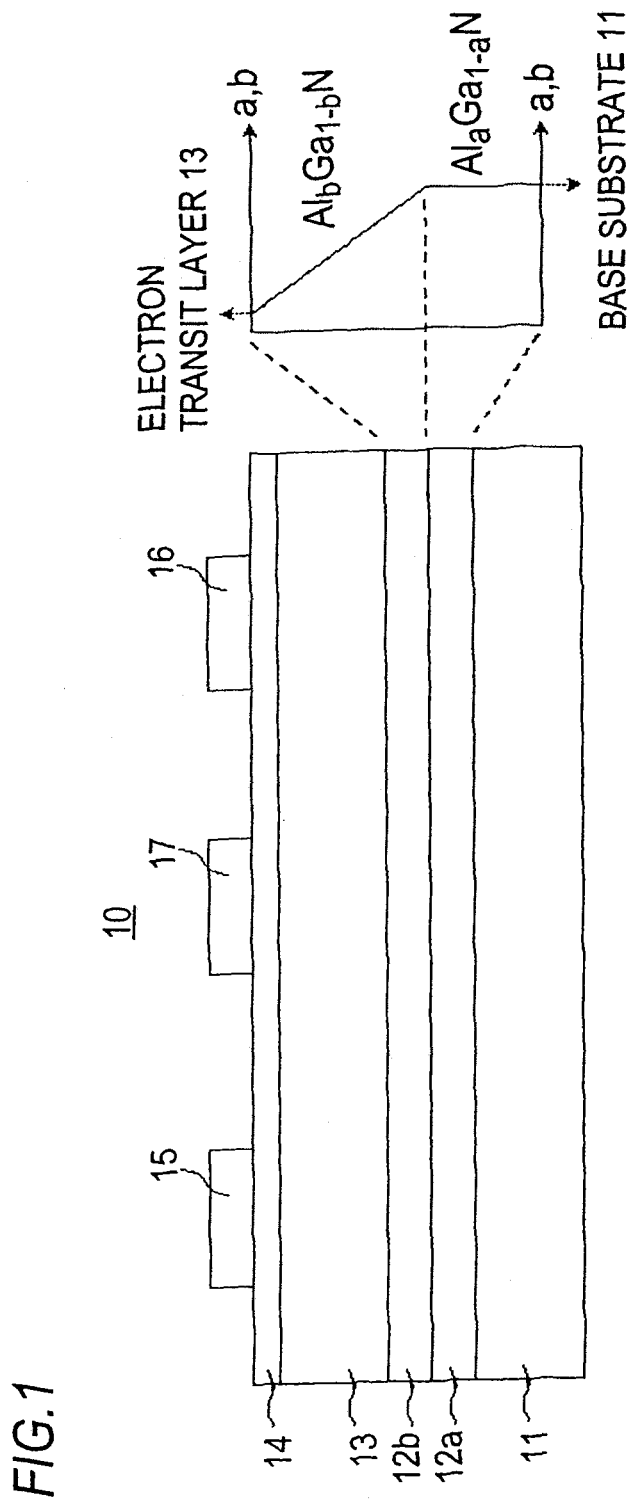
FIG. 1 is a view showing a cross-section structure of a HEMT device and composition distribution of a buffer layer according to a first exemplary embodiment of the present invention.

FIG. 1 is a view showing a cross-section structure of a HEMT device 10 (left side) and composition distribution of Al in a buffer layer (right side), according to a first exemplary embodiment of the present invention. The HEMT device 10 is used AlN (aluminum nitride) as a base substrate 11. A non-doped $Al_aGa_{1-a}N$ (0<a<1) layer, in which composition ratio a of Al is constant, is formed as a first buffer layer 12a on the base substrate 11. Meantime, the term "non-doped' means that an impurity injection is not performed in order to control a conductance level.

A non-doped $Al_bGa_{1-b}N$ (0<b<1) layer is formed as a second buffer layer 12b on the first buffer layer 12a. In the second buffer layer 12b, a composition ratio b of Al changes with slant in a thickness direction (vertical direction) of the substrate. In the embodiment, in the second buffer layer 12b, a composition ratio b of Al at a region adjacent to the first buffer layer 12a is larger than that at a side adjacent to the electron transit layer 13. Further, in the second buffer layer 12b, a composition ratio b of Al may be gradually increased from the region adjacent to a electron transit layer 13 to the region adjacent to the first buffer layer 12a.

On the second buffer layer 12b, an electron transit layer 13 made of non-doped GaN and an electron supply layer 14 made of non-doped AlGaN on the layer 13 are sequentially formed by Molecular Beam Epitaxy (MBE) method or Metal Organic Vapor Phase Epitaxy (MOVPE) method. The non-doped AlGaN forming the electron supply layer 14 is, specifically, $Al_mGa_{1-m}N$ (0<m<1; preferably, m=about 0.20). The electron transit layer 13 and the electron supply layer 14 functions together as an active layer in the HEMT device 10.

A source electrode (first main electrode) 15 and a drain electrode (second main electrode) 16 are formed on the electron supply layer 14. Between the a source electrode 15 and the drain electrode 14, the two-dimensional electron gas layer is formed at a side of the electron transit layer 13 in an interface between the electron transit layer 13 and the electron supply layer 14. Turning on/off operation of a channel made of the two-dimensional electron gas layer is controlled by voltage applied to a gate electrode (control electrode) 17 through a depletion layer. The source electrode 15 and the drain electrode 16 are made of the material, such as Ti/Au, which is ohmic-contacting with the two-dimensional electron gas layer (2DEG layer). The gate electrode 17 is made of the material, such as Ni/Au, which is schottky-contacting with the non-doped AlGaN layer, which is forming the depletion layer within the non-doped AlGaN. Meanwhile, the electron supply layer 14 may be made of stacked AlGaN layer with n type conductance. The 2DEG layer is one example of a two-dimensional carrier gas layer.

The HEMT device 10 is configured in that: the first buffer layer 12a is made of $Al_aIn_{1-a}N$; and the composition ratio b of Al in the second buffer layer 12b changes as described above. That is, the HEMT device 10 is configured in that: a comparatively small lattice-mismatch (small difference between lattice constants) is occurred between the base substrate 11 and the first buffer layer 12a; and a lattice-mismatch between the first buffer layer 12a and the second buffer layer 12b; and a lattice-mismatch between the second buffer layer 12b and the electron transit layer 13 is reduced.

Figure 2:
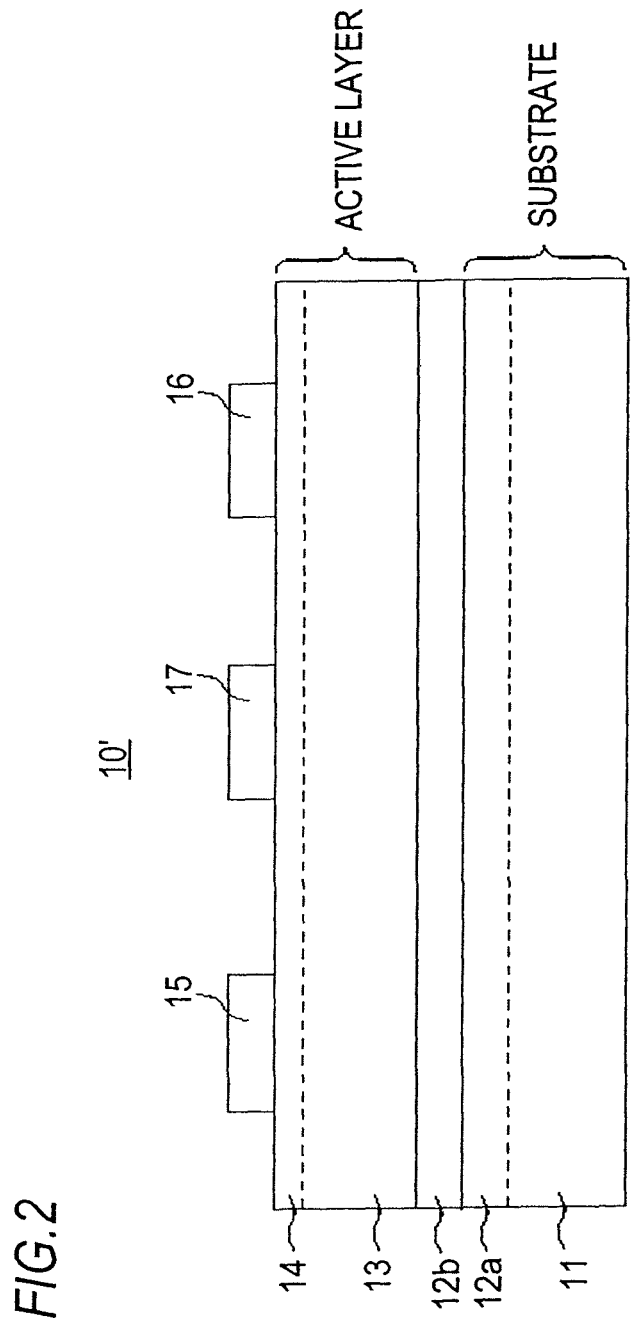
FIG. 2 is a view showing a cross-section structure of a HEMT device according to the first exemplary embodiment of the present invention.

Here, the structure of the HEMT device 10 may be deemed as the HEMT device 10' as shown in FIG. 2. That is, a substrate made of $Al_{a'}Ga_{1-a'}N$ (0<a'≦1) layer includes the base substrate 11 and the first buffer layer 12a, an active layer made of $Al_{m'}Ga_{1-m'}N$ (0≦m'<1) layer includes the electron transit layer 13 and the electron supply layer 14, and the second buffer layer 12b is disposed between the first buffer layer 12a and the electron transit layer 13. In addition, in order to accomplish function effects as will be described later, it is preferable that the composition ratios of Al in each substrate and layer of the HEMT device 10' have following relationship: a'>b>m'.

Effects of the HEMT device 10 and 10' according to this embodiment will be described.

According to the embodiments of the invention, since the substrate made of $Al_{a'}Ga_{1-a'}N$ layer (0<a'≦1) has a high composition ratio of Al, the substrate has high insulation property and is enable to suppress the leak current flowing in the vertical direction of the HEMT device.

Further, by forming the first buffer layer 12a, piezo electrical field affecting between the base substrate 11 and the first buffer layer 12a is reduced. Further, composition changes in the semiconductor layer forming the hetero junction is suppressed, so that 2DEG layer is hardly formed near the hetero junction interface. As a result, it is enable to suppress the leak current flowing between the source electrode 15 and drain electrode 16 of the HEMT device.

Furthermore, according to the embodiments of the invention, the composition ratio of Al changes in the thickness direction (vertical direction) of the second buffer layer 12b. According thereto, a stress affecting between the first buffer layer 12a and the second buffer layer 12b and a stress affecting between the second buffer layer 12b and the electron transit layer 13 can be suppressed. Thus, the crystalline defects including dislocations arising from the lattice-mismatches at the junction interfaces between the layers can be suppressed, and the crystal quality can be improved. Consequently, the electrical characteristic of the HEMT device, such as the on-resistance or the current collapse, can be improved.

Meantime, when the second buffer layer 12b is formed by MOVPE method, the flow rate of source gas of Al (for example, TMA: trimethylaluminum) may change with the passage of time. Similarly, when the buffer layer 12 is formed by MBE method, Al molecular beam intensity may be adjusted.

Figure 3:
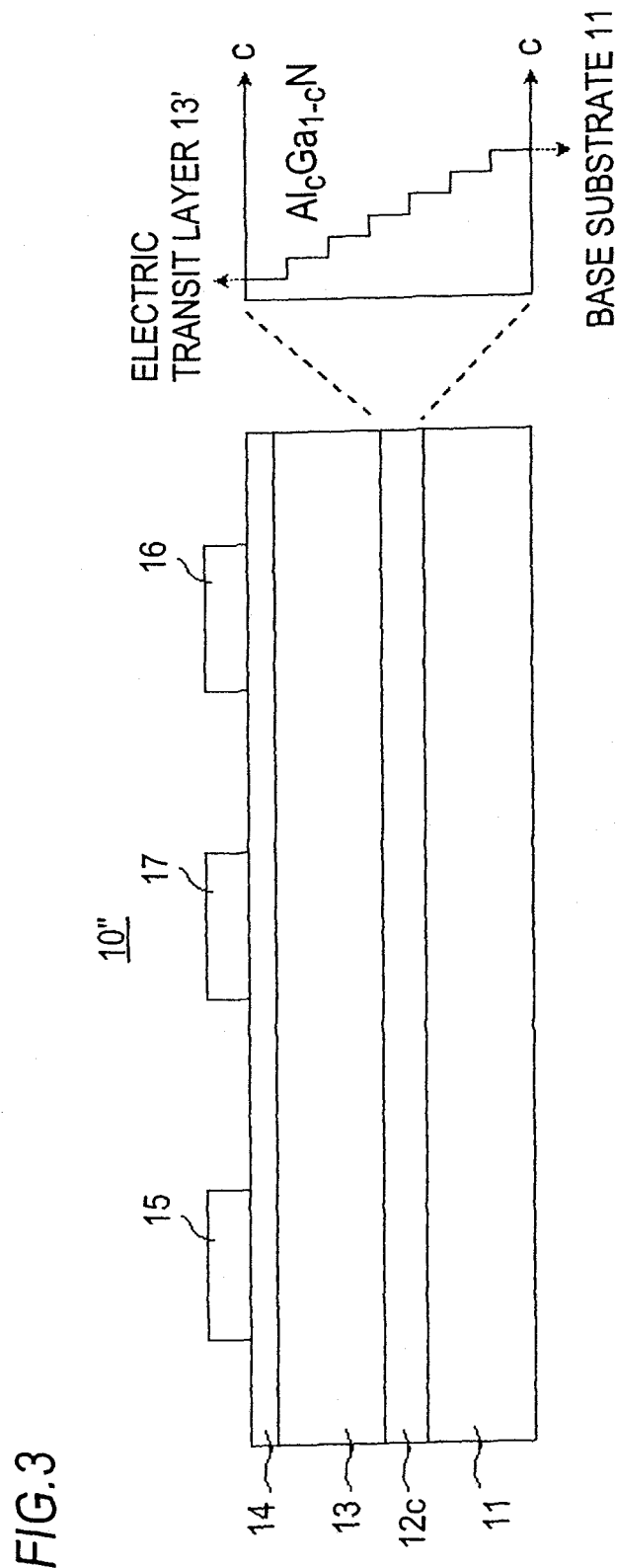
FIG. 3 is a view showing a cross-section structure of a HEMT device and composition distribution of a buffer layer according to a modification of the first exemplary embodiment of the present invention.

A modification of the first exemplary embodiment of the present invention will be described. FIG. 3 shows a cross-section structure of an HEMT device 10" (left side) and composition distribution of a buffer layer (right side), according to a modification of exemplary embodiment of the present invention. In the HEMT device 10", a third buffer layer 12c is provided instead of the first layer 12a and second buffer layer 12b in the HEMT device 10. A non-doped $Al_cGa_{1-c}N$ (0<c<1)

layer is formed as a third buffer layer 12c on the base substrate 11. In the third buffer layer 12c, composition ratio c of Al changes with a multi-step shape in the thickness direction. In other words, the third buffer layer 12c is configured that such a plurality of AlGaN layers each having a different composition ratio are respectively stacked.

Effects obtained by changing the composition ratio of Al across the entire thickness of the buffer layer as in the HEMT device 10" are similarly to that of the HEMT device 10 and 10'. Incidentally, changing the composition ratio of Al may be appropriately chosen from the continuous changing as in the HEMT device 10 or the stepwise changing as in the HEMT device 10".

Figure 4:
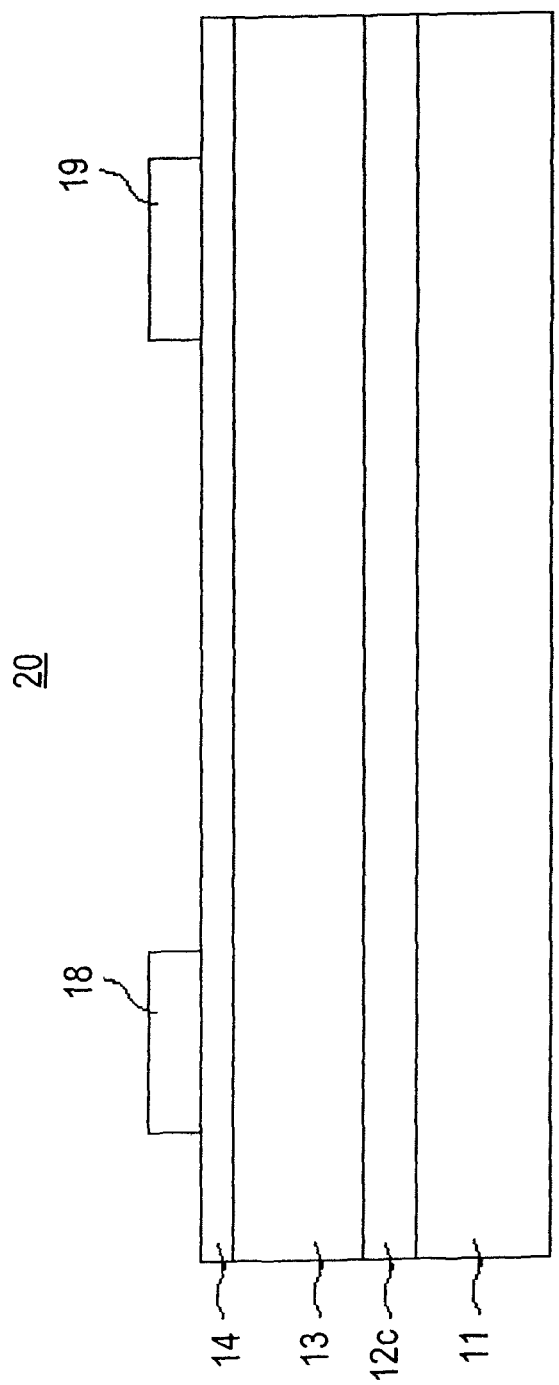
FIG. 4 is a view showing a cross-section structure of a SBD device according to a second exemplary embodiment of the present invention.
Figure 5:
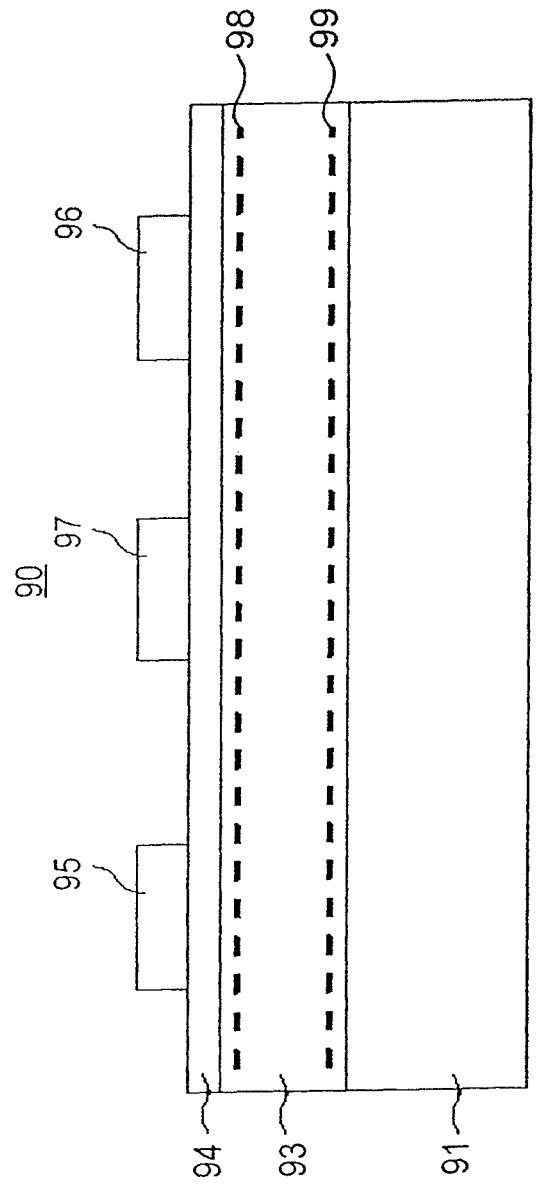
FIG. 5 is a view showing a cross-section structure of a related-art of a HEMT device using a nitride semiconductor.

FIG. 4 shows a cross-section structure of Schottky Barrier Diode (SBD) device 20 according to a second exemplary embodiment of the present invention. In the SBD device 20, an anode electrode (first main electrode) 18 and a cathode electrode (second main electrode) 19 are provided instead of the source electrode 15 and a drain electrode 16 in the HEMT device 10", and the gate electrode 17 does not exist.

The anode electrode 18 is made of the material, such as palladium (Pd), which is schottky-contacting with the 2DEG layer (two-dimensional electron gas layer) formed in the electron transit layer 13. The cathode electrode 19 is made of the material, such as Ti/Au, which is ohmic-contacting with the 2DEG layer.

The SBD device 20 according to the second embodiment is able to obtain the same effects in the HEMT device 10, 10' according to the first embodiment.

As described above, although certain exemplary embodiments of the present invention have been described in detail, the present invention is not limited to the certain exemplary embodiments. Certain changes, combinations and modifications within a scope of the invention may be possible. For example, although the present invention is applied to the embodiments of the HEMT device, the present invention is obviously applicable to the other electronic devices such as MISFET. In addition, it is possible that AlGaN is used as material of the substrate and a semiconductor layer forming the electron transit layer is made of AlGaN layer. Moreover, it is possible that the electron transit and supply layers are configured so that a two-dimensional hole gas layer is formed instead of the two-dimensional electron gas layer.

What is claimed is:

1. A semiconductor device comprising:
   a substrate, which has a composition represented by the formula:

AlN an active layer, which is formed on the substrate, and which has a composition represented by the formula:

$Al_{m'}Ga_{1-m'}N$, wherein $m'$ satisfies $0 \leq m' < 1$;

a buffer layer disposed between the active layer and the substrate; and
   a first main electrode and a second main electrode, which are formed on the active layer, and which are separated from each other,
   wherein the semiconductor device is operated by electric current flowing between the first main electrode and the second main electrode in the active layer, and
   wherein the buffer layer includes:
      a first buffer layer, which is formed to directly contact with the substrate, and which has a composition represented by the formula:

$Al_aGa_{1-a}N$, wherein a composition ratio $a$ satisfies $0 < a < 1$, and a second buffer layer, which is formed between the first buffer layer and the active layer, and which has a composition represented by the formula:

$Al_bGa_{1-b}N$, wherein the composition ratio b satisfies $0 < b < 1$;
   wherein the composition ratio a is larger than the composition ratio b;
   wherein the composition ratio b satisfies $m' < b < 1$;
   wherein the composition ratio a in the first buffer layer is constant in a direction vertical to the substrate; and
   wherein, in the second buffer layer, the composition ratio b is gradually increased from a region adjacent to the active layer to a region adjacent to the first buffer layer.

2. The semiconductor device according to claim 1, wherein the composition ratio of Al in the second buffer layer changes in the direction vertical to the substrate.

3. The semiconductor device according to claim 1, wherein, in the second buffer layer, the composition ratio b at the region adjacent to the first buffer layer is smaller than the composition ratio b at the region adjacent to the active layer.

4. The semiconductor device according to claim 1, wherein the active layer comprises:
   an electron transit layer and an electron supply layer forming a hetero junction; and
   a two-dimensional carrier gas layer formed by the hetero junction.

5. The semiconductor device according to claim 1, wherein the first main electrode is an anode electrode, and wherein the second main electrode is a cathode electrode.

6. The semiconductor device according to claim 1, further comprising
   a control electrode, which is provided between the first main electrode and the second main electrode on the active layer,
   wherein the first main electrode is a source electrode,
   wherein the second main electrode is a drain electrode, and
   wherein the control electrode is a gate electrode.

7. A semiconductor device comprising:
   an active layer including an electron transit layer and an electron supply layer;
   a base substrate;
   a first buffer layer formed directly on the base substrate;
   a second buffer layer formed between the first buffer layer and the active layer; and
   a first electrode and a second electrode, which are formed on the electron supply layer, and which are separated from each other,
   wherein the electron supply layer has a composition represented by the formula:

$Al_mGa_{1-m}N$, wherein a composition ratio $m$ satisfies $0 \leq m' < 1$;

wherein the first buffer layer has a composition represented by the formula:

$Al_aGa_{1-a}N$, wherein a composition ratio $a$ satisfies $0 < a < 1$; and wherein the second buffer layer has a composition represented by the formula:

$Al_bGa_{1-b}N$, wherein a composition ratio b satisfies $0 < b < 1$, and
   wherein the composition ratio b satisfies $m < b < a$;
   wherein the composition ratio a in the first buffer layer is constant in a direction vertical to the base substrate; and wherein, in the second buffer layer, the composition ratio b is gradually increased from a region adjacent to the active layer to a region adjacent to the first buffer layer.

8. A semiconductor device according to claim 7, the composition ratio of Al in the second buffer layer changes in the direction vertical to the base substrate.

* * * * *